United States Patent
Pan et al.

(10) Patent No.: US 7,510,966 B2
(45) Date of Patent: Mar. 31, 2009

(54) ELECTRICALLY CONDUCTIVE LINE, METHOD OF FORMING AN ELECTRICALLY CONDUCTIVE LINE, AND METHOD OF REDUCING TITANIUM SILICIDE AGGLOMERATION IN FABRICATION OF TITANIUM SILICIDE OVER POLYSILICON TRANSISTOR GATE LINES

(75) Inventors: Qi Pan, Boise, ID (US); Jiutao Li, Boise, ID (US); Yongjun Jeff Hu, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 454 days.

(21) Appl. No.: 11/074,106

(22) Filed: Mar. 7, 2005

(65) Prior Publication Data

US 2006/0197225 A1    Sep. 7, 2006

(51) Int. Cl.
H01L 21/4763 (2006.01)
(52) U.S. Cl. .................................................. 438/648
(58) Field of Classification Search ............ 438/258, 438/648; 427/576; 257/390
See application file for complete search history.

(56) References Cited

U.S. PATENT DOCUMENTS

| 3,809,574 A | 5/1974 | Duffy et al. |
| 3,990,927 A | 11/1976 | Montier |
| 4,474,975 A | 10/1984 | Clemons et al. |
| 4,836,885 A | 6/1989 | Breiten et al. |
| 5,105,888 A | 4/1992 | Pollock |

(Continued)

FOREIGN PATENT DOCUMENTS

EP    0817251 A    1/1998

(Continued)

OTHER PUBLICATIONS

Beekmann et al., *Sub-micron Gap Fill and In-Situ Planarisation Using Flowfill™ Technology*, Electrotech 1-7 ULSI Conference, Portland, OR (Oct. 1995).

(Continued)

*Primary Examiner*—Carl Whitehead, Jr.
*Assistant Examiner*—Monica D Harrison
(74) *Attorney, Agent, or Firm*—Wells St. John P.S.

(57) ABSTRACT

The invention includes an electrically conductive line, methods of forming electrically conductive lines, and methods of reducing titanium silicide agglomeration in the fabrication of titanium silicide over polysilicon transistor gate lines. In one implementation, a method of forming an electrically conductive line includes providing a silicon-comprising layer over a substrate. An electrically conductive layer is formed over the silicon-comprising layer. An $MSi_xN_y$-comprising layer is formed over the electrically conductive layer, where "x" is from 0 to 3.0, "y" is from 0.5 to 10, and "M" is at least one of Ta, Hf, Mo, and W. An $MSi_z$-comprising layer is formed over the $MSi_xN_y$-comprising layer, where "z" is from 1 to 3.0. A $TiSi_a$-comprising layer is formed over the $MSi_z$-comprising layer, where "a" is from 1 to 3.0. The silicon-comprising layer, the electrically conductive layer, the $MSi_xN_y$-comprising layer, the $MSi_z$-comprising layer, and the $TiSi_a$-comprising layer are patterned into a stack comprising an electrically conductive line. Other aspects and implementations are contemplated.

36 Claims, 7 Drawing Sheets

U.S. PATENT DOCUMENTS

| | | | |
|---|---|---|---|
| 5,156,881 A | 10/1992 | Okano et al. |
| 5,182,221 A | 1/1993 | Sato |
| 5,387,539 A | 2/1995 | Yang et al. |
| 5,410,176 A | 4/1995 | Liou et al. |
| 5,470,798 A | 11/1995 | Ouellet |
| 5,516,721 A | 5/1996 | Galli et al. |
| 5,518,959 A | 5/1996 | Jang et al. |
| 5,565,376 A | 10/1996 | Lur et al. |
| 5,604,149 A | 2/1997 | Paoli et al. |
| 5,616,513 A | 4/1997 | Shepard |
| 5,702,977 A | 12/1997 | Jang et al. |
| 5,719,085 A | 2/1998 | Moon et al. |
| 5,741,740 A | 4/1998 | Jang et al. |
| 5,770,469 A | 6/1998 | Uram et al. |
| 5,776,557 A | 7/1998 | Okano et al. |
| 5,786,039 A | 7/1998 | Brouquet |
| 5,786,263 A | 7/1998 | Perera |
| 5,801,083 A | 9/1998 | Yu et al. |
| 5,863,827 A | 1/1999 | Joyner |
| 5,883,006 A | 3/1999 | Iba |
| 5,888,880 A | 3/1999 | Gardner et al. |
| 5,895,253 A | 4/1999 | Akram |
| 5,895,255 A | 4/1999 | Tsuchiaki |
| 5,904,540 A | 5/1999 | Sheng et al. |
| 5,923,073 A | 7/1999 | Aoki et al. |
| 5,930,645 A | 7/1999 | Lyons et al. |
| 5,930,646 A | 7/1999 | Gerung et al. |
| 5,943,585 A | 8/1999 | May et al. |
| 5,950,094 A | 9/1999 | Lin et al. |
| 5,960,299 A | 9/1999 | Yew et al. |
| 5,972,773 A | 10/1999 | Liu et al. |
| 5,976,949 A | 11/1999 | Chen |
| 5,981,354 A | 11/1999 | Spikes et al. |
| 5,989,978 A | 11/1999 | Peidous |
| 5,998,280 A | 12/1999 | Bergemont et al. |
| 6,013,583 A | 1/2000 | Ajmera et al. |
| 6,030,881 A | 2/2000 | Papasouliotis et al. |
| 6,033,961 A | 3/2000 | Xu et al. |
| 6,051,477 A | 4/2000 | Nam |
| 6,069,055 A | 5/2000 | Ukeda et al. |
| 6,090,675 A | 7/2000 | Lee et al. |
| 6,127,737 A | 10/2000 | Kuroi et al. |
| 6,156,674 A | 12/2000 | Li et al. |
| 6,171,962 B1 | 1/2001 | Karlsson et al. |
| 6,187,651 B1 | 2/2001 | Oh |
| 6,190,979 B1 | 2/2001 | Radens et al. |
| 6,191,002 B1 | 2/2001 | Koyanagi |
| 6,245,641 B1 | 6/2001 | Shiozawa et al. |
| 6,265,282 B1 | 7/2001 | Lane et al. |
| 6,300,219 B1 | 10/2001 | Doan et al. |
| 6,326,282 B1 | 12/2001 | Park et al. |
| 6,329,266 B1 | 12/2001 | Hwang et al. |
| 6,331,380 B1 | 12/2001 | Ye et al. |
| 6,355,966 B1 | 3/2002 | Trivedi |
| 6,448,150 B1 | 9/2002 | Tsai et al. |
| 6,455,394 B1 | 9/2002 | Iyer et al. |
| 6,524,912 B1* | 2/2003 | Yang et al. ................. 438/258 |
| 6,534,395 B2 | 3/2003 | Werkhoven et al. |
| 6,583,028 B2 | 6/2003 | Doan et al. |
| 6,583,060 B2 | 6/2003 | Trivedi |
| 6,607,959 B2 | 8/2003 | Lee et al. |
| 6,617,251 B1 | 9/2003 | Kamath et al. |
| 6,674,132 B2* | 1/2004 | Willer ........................ 257/390 |
| 6,719,012 B2 | 4/2004 | Doan et al. |
| 6,821,865 B2 | 11/2004 | Wise et al. |
| 6,930,058 B2 | 8/2005 | Hill et al. |
| 6,933,225 B2 | 8/2005 | Werkhoven et al. |
| 7,033,909 B2 | 4/2006 | Kim et al. |
| 7,053,010 B2 | 5/2006 | Li et al. |
| 7,141,278 B2* | 11/2006 | Koh et al. ................... 427/576 |
| 2001/0006255 A1 | 7/2001 | Kwon et al. |
| 2001/0006839 A1 | 7/2001 | Yeo |
| 2001/0046753 A1 | 7/2001 | Yeo |
| 2001/0041250 A1 | 11/2001 | Haukka et al. |
| 2002/0000195 A1 | 1/2002 | Kao et al. |
| 2002/0004284 A1 | 1/2002 | Chen |
| 2002/0018849 A1 | 2/2002 | George et al. |
| 2003/0032281 A1 | 2/2003 | Werkhoven et al. |
| 2003/0129826 A1 | 7/2003 | Werkhoven et al. |
| 2004/0016987 A1 | 1/2004 | Sawada et al. |
| 2004/0032006 A1 | 2/2004 | Yun et al. |
| 2004/0082181 A1 | 4/2004 | Doan et al. |
| 2004/0209484 A1 | 10/2004 | Hill et al. |
| 2005/0009293 A1 | 1/2005 | Kim et al. |
| 2005/0009368 A1 | 1/2005 | Vaartstra |
| 2005/0054213 A1 | 3/2005 | Derderian et al. |
| 2005/0079730 A1 | 4/2005 | Beintner et al. |
| 2005/0112282 A1 | 5/2005 | Gordon et al. |
| 2005/0124171 A1 | 6/2005 | Vaartstra |
| 2005/0142799 A1 | 6/2005 | Seo |

FOREIGN PATENT DOCUMENTS

| | | |
|---|---|---|
| EP | 959493 A2 | 11/1999 |
| JP | 02277253 A | 11/1990 |
| JP | 05-315441 | 11/1993 |
| JP | 06-334031 | 12/1994 |
| JP | 146224 | 1/1996 |
| US | 2004/021156 | 12/2005 |
| WO | 02/27063 A2 | 4/2002 |

OTHER PUBLICATIONS

Curtis, et al., *APCVD TEOS: $O_3$ Advanced Trench Isolation Applications*, Semiconductor Fabtech, $9^{th}$ Ed., pp. 241-247 (pre-Jul. 2003).
Disclosed Anonymous 32246, *Substrate Contact With Closed Bottom Trenches*, Research Disclosure, 1 page (Feb. 1991).
Gasser et al., *Quasi-monolayer deposition of silicon dioxide*, 250 Thin Solid Films, pp. 213-218 (1994).
George et al., *Atomic layer controlled deposition of $SiO_2$ and $Al_2O_3$ using ABAB . . . binary reaction sequence Chemistry*, 82/83 Applied Surface Science, pp. 460-467 (1994).
Hasumann et al., *Catalytic vapor deposition of highly conformal silica nanolaminates*, Department of Chemistry and Chemical Biology, Harvard University, pp. 1-13 (May 14, 2002).
Hausmann et al., *Rapid Vapor Deposition of Highly Conformal Silica Nanolaminates*, 298 Science, pp. 402-406 (Oct. 11, 2002).
Horie et al., *Kinetics and Mechanism of the Reactions of $O(^3P)$ with $SiH_4$, $CH_3SiH_3$, $(CH_3)_2SiH_2$, and $(CH_3)_3SiH$*, 95 J. Phys. Chem., pp. 4393-4400 (1991).
Joshi et al., *Plasma Deposited Organosilicon Hydride Network Polymers as Versatile Resists for Entirely Dry Mid-Deep UV Photolithography*, 1925 SPIE, pp. 709-720 (1993).
PCT/US2004/021156; Filed Jun 30, 2004 Search Report.
Kiermasz et al., *Planarisation for Sub-Micron Devices Utilising a New Chemistry*, 1-2 Electrotech, Dumic Conference, California (Feb. 1995).
Klaus et al., *Atomic Layer Deposition of $SiO_2$ Using Catalyzed and Uncatalyzed Self-Limiting Surface Reactions*, 6 Surface Review and Letters, Nos. 3 & 4, pp. 435-448 (1999).
Kojima et al., *Planarization Process Using a Multi-Coating of Spin-on-Glass*, V-MIC Conference, California, 2 pages (1995).
Matsuura et al., *A Highly Reliable Self-planarizing Low-k Intermetal Dielectric for Sub-quarter Micron Interconnects*, IEEE, pp. 785-788 (1997).
Matsuura et al., *Novel Self-planarizing CVD Oxide for Interlayer Dielectric Applications*, IEEE, pp. 117-120 (1994).
McClatchie et al., *Low Dielectric Constant Flowfill™ Technology for IMD Applications*, 7 pps. (pre-Aug. 1999).
Miller et al., *Self-limiting chemical vapor deposition of an ultra-thin silicon oxide film using tri-(tert-butoxy)silanol*, 397 Thin Solid Films, pp. 78-82 (2001).
Morishita et al., *Atomic-layer chemical-vapor-deposition of silicon-nitride*, 112 Applied Surface Science, pp. 189-204 (1997).

Shareef et al., *Subatmospheric chemical vapor deposition ozone/TEOS process for SiO₂ trench filling*, J. Vac. Sci. Technol. B 13(4), pp. 1888-1995 (Jul./Aug. 1995).

U.S. Appl. No. 10/806,923, filed Mar. 2004, Li et al.

U.S. Appl. No. 10/931,524, filed Aug. 2004, Sandhu.

Withnall et al., *Matrix Reactions of Methylsilanes and Oxygen Atoms*, 92 J. Phys. Chem., pp. 594-602, 1988.

Yokoyama et al., *Atomic layer controlled deposition of silicon nitride and in situ growth observation by infrared reflection absorption spectroscopy*, 112 Applied Surface Science, pp. 75-81 (1997).

U.S. Appl. No. 10/609,282, filed Jun. 26, 2003, Yongjun Jeff Hu (as filed and amended).

Chen et al., *Excimer Laser-Induced Ti Silicidation to Eliminate the Fine-Line Effect for Integrated Circuity Device Fabrication*, 149 Journal of Electrochemical Society, No. 11, pp. G609-G612 (2002).

Nishiyama et al., *Agglomeration Resistant Self-Aligned Silicide Process Using $N_2$ Implantation into $TiSl_2$*, 36 Jpn. J. Appl. Phys., Part 1, No. 6A, pp. 3639-3643 (Jun. 1997).

Wolf, *Chapter 13: Polycides and Salicides of TiSix, CoSi2, and NiSi*, Silicon Processing for the VLSI Era, vol. IV, pp. 603-604 (pre-2003).

* cited by examiner

ELECTRICALLY CONDUCTIVE LINE, METHOD OF FORMING AN ELECTRICALLY CONDUCTIVE LINE, AND METHOD OF REDUCING TITANIUM SILICIDE AGGLOMERATION IN FABRICATION OF TITANIUM SILICIDE OVER POLYSILICON TRANSISTOR GATE LINES

TECHNICAL FIELD

This invention relates to electrically conductive lines, to methods of forming electrically conductive lines, and to methods of reducing titanium silicide agglomeration in the fabrication of titanium silicide over polysilicon transistor gate lines.

BACKGROUND OF THE INVENTION

One common component found in integrated circuits is an electrically conductive line. Such might form part of a device or subcircuit, or interconnect various devices. One common conductive line is a transistor gate of a field effect transistor device. Such are commonly used in memory integrated circuitry, for example dynamic random access memory (DRAM) circuitry. Individual memory cells of DRAM circuitry include a field effect transistor having one source/drain region thereof electrically connected with a storage capacitor, and the other source/drain region electrically connected with a bitline. The conductive transistor gate lines are commonly referred to as wordlines, with individual gate lines constituting a part of several memory cell field effect transistors.

A common wordline construction includes titanium silicide ($TiSi_x$) received over conductively doped polysilicon. The titanium silicide might be provided over the polysilicon in a number of manners. For example, elemental titanium might be deposited upon polysilicon and thereafter annealed to react the polysilicon and titanium to form titanium silicide. Alternately by way of examples only, titanium silicide might be chemical vapor deposited upon polysilicon or physical vapor deposited by sputtering from a titanium silicide target. Further and regardless, the titanium silicide which is formed might initially be amorphous or crystalline. Crystallinity is desired for reduced resistance/higher conductance. Amorphous titanium silicide can be converted to crystalline titanium silicide by high temperature anneal.

Crystalline stoichiometric titanium silicide ($TiSi_2$) typically exists in one of two different crystalline phases. A first phase is an orthorhombic base-centered phase having twelve atoms per unit cell, a resistivity of about 60 to 90 microohm-cm, and is known as the C49 phase. A second phase is a more thermodynamically-favored orthorhombic face-centered phase, which has 24 atoms per unit cell and a resistivity of about 12 to 20 microohm-cm, and is known as the C54 phase. Regardless of deposition method, it is common for the less-desired C49 phase to be initially deposited or formed. This C49 phase can then be converted to a desired C54 phase through appropriate annealing conditions.

One problem associated with the fabrication of such lines is known as agglomeration of the titanium silicide relative to the underlying polysilicon. Such typically manifests when the substrate is exposed to temperatures in excess of 900° C. and which typically inherently occurs during the fabrication of the circuitry. Agglomeration is characterized by the titanium silicide migrating/extending into the underlying polysilicon. Such can be to such a degree to extend completely through the polysilicon. For transistor gate lines, the migration can even be to completely through the gate dielectric, thereby causing a fatal short. Further, the degree of agglomeration is not predictable or controllable from device to device. For transistor gates that are not fatally shorted, this undesirably creates different operating characteristics for different devices. Specifically, the degree of agglomeration within the polysilicon affects its work function and, accordingly, the threshold voltage along the gate line at which individual transistors are turned "on" and "off".

In an effort to reduce titanium silicide agglomeration, previous studies have focused on applying different annealing processes or adding other elements to the titanium silicide. Still, needs remain for improved methods of reducing titanium silicide agglomeration in the fabrication of titanium silicide over polysilicon transistor gate lines, and particularly in the fabrication of DRAM circuitry. Yet while the invention was motivated in addressing these issues, it is in no way so limited. The invention is only limited by the accompanying claims as literally worded, without interpretative or other limiting reference to the specification, and in accordance with the doctrine of equivalents.

SUMMARY

The invention includes an electrically conductive line, methods of forming electrically conductive lines, and methods of reducing titanium silicide agglomeration in the fabrication of titanium silicide over polysilicon transistor gate lines. In one implementation, a method of forming an electrically conductive line includes providing a silicon-comprising layer over a substrate. An electrically conductive layer is formed over the silicon-comprising layer. An $MSi_xN_y$-comprising layer is formed over the electrically conductive layer, where "x" is from 0 to 3.0, "y" is from 0.5 to 10, and "M" is at least one of Ta, Hf, Mo, and W. An $MSi_z$-comprising layer is formed over the $MSi_xN_y$-comprising layer, where "z" is from 1 to 3.0. A $TiSi_a$-comprising layer is formed over the $MSi_z$-comprising layer, where "a" is from 1 to 3.0. The silicon-comprising layer, the electrically conductive layer, the $MSi_xN_y$-comprising layer, the $MSi_z$-comprising layer, and the $TiSi_a$-comprising layer are patterned into a stack comprising an electrically conductive line.

In one implementation, the invention contemplates an electrically conductive line independent of the method of fabrication.

In one implementation, a method of reducing titanium silicide agglomeration in fabrication of titanium silicide over polysilicon transistor gate lines comprises interposing a composite of an $MSi_z$-comprising layer over an $MSi_xN_y$-comprising layer over an $MSi_w$-comprising layer intermediate the titanium silicide and polysilicon, where "w" and "z" respectively are from 1 to 3.0, where "x" is from 0 to 3.0, "y" is from 0.5 to 10, and "M" is at least one of Ta, Hf, Mo, and W.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
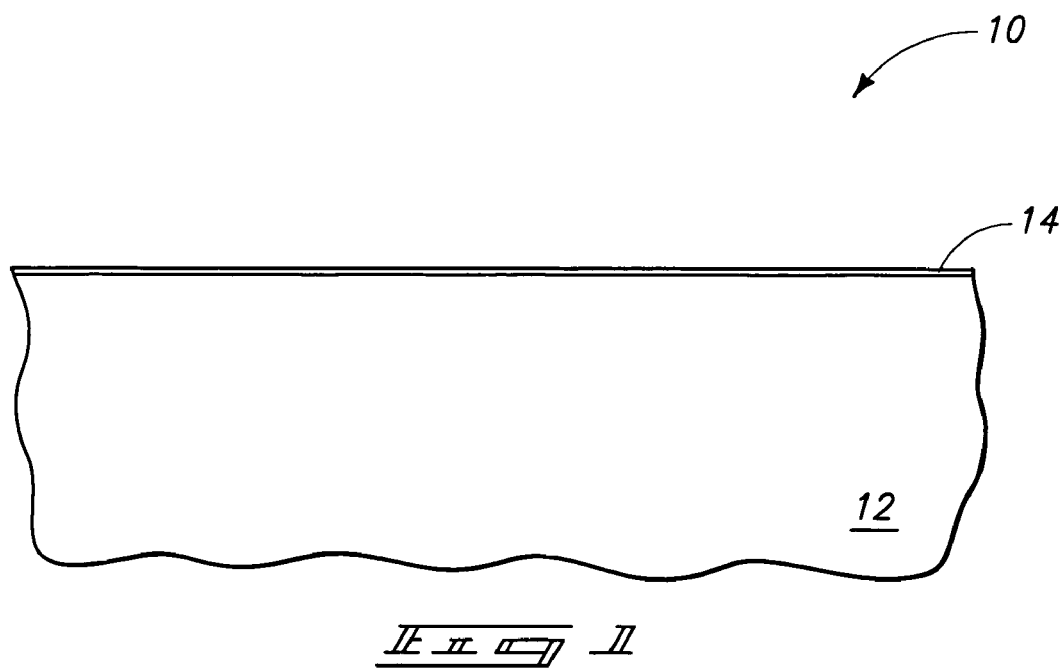
FIG. 1 is a diagrammatic, cross-sectional view of a semiconductor wafer fragment in process in accordance with an aspect of the invention.

A preferred method of forming an electrically conductive line, and particularly a field effect transistor gate line, is initially described with reference to FIGS. 1-9. Referring to FIG. 1, a substrate fragment is indicated generally with the reference numeral 10. Such preferably comprises a semiconductor substrate, for example a substrate comprising a bulk monocrystalline silicon region 12 having a gate dielectric layer 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, substrate fragment 10 might comprise semiconductor-on-insulator substrates or other substrates, and whether existing or yet-to-be developed. Discussion proceeds with an exemplary preferred fabrication of a transistor gate line with a gate dielectric layer 14 thereby being provided. Of course, electrically conductive lines other than field effect transistor gates are also contemplated. An exemplary preferred material 14 is silicon dioxide deposited or grown to an exemplary thickness of from 10 Angstroms to 100 Angstroms.

Figure 2:
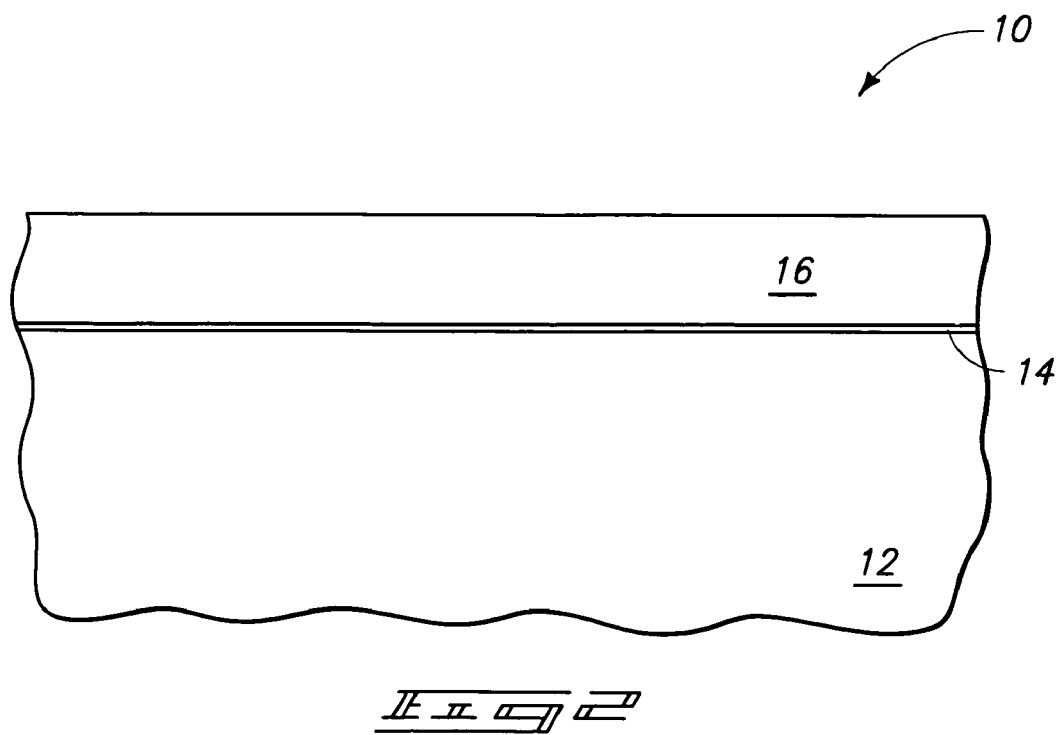
FIG. 2 is a view of the FIG. 1 wafer fragment at a point of processing subsequent to that depicted by FIG. 1.

Referring to FIG. 2, a silicon-comprising layer 16 has been formed over substrate 12/14. An exemplary preferred silicon-comprising material 16 is polysilicon. By way of example only, alternate silicon-comprising materials include monocrystalline silicon, such as epitaxially grown silicon, and silicon combined with other materials in a non-compound or non-stoichiometric manner, for example silicon and germanium. Silicon-comprising layer 16 will ultimately form a conductive portion of the conductive line, and will thereby at some point be electrically conductive. Accordingly, silicon-comprising layer 16 might be electrically conductive as-deposited, for example by in situ doping with a conductivity enhancing impurity during deposition. Alternately, such might be implanted or otherwise processed later to render such layer electrically conductive if not in such state as initially deposited. An exemplary preferred thickness range for silicon-comprising layer 16 is from 400 Angstroms to 5,000 Angstroms, with 700 Angstroms being a specific preferred example.

Figure 3:
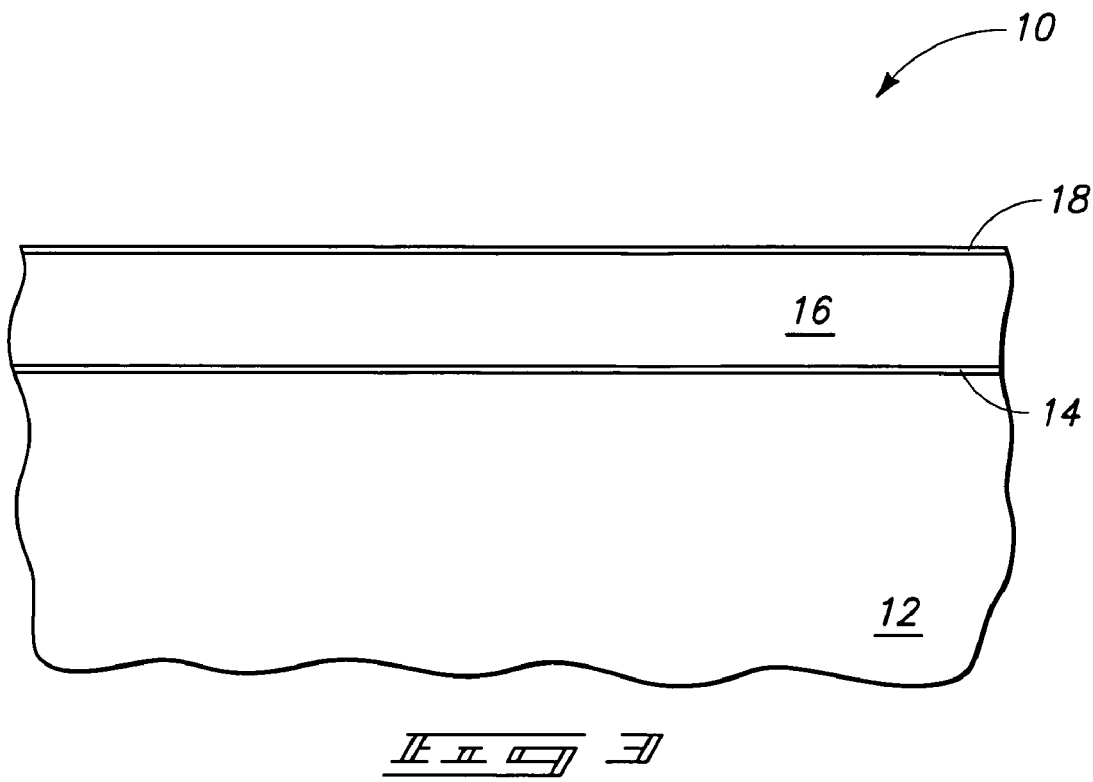
FIG. 3 is a view of the FIG. 2 wafer fragment at a point of processing subsequent to that depicted by FIG. 2.

Referring to FIG. 3, an electrically conductive layer 18 has been formed over silicon-comprising layer 16. Further preferably and as shown, layer 18 is formed "on" silicon-comprising layer 16, with "on" in the context of this document meaning in at least some direct physical contacting relationship with the stated layer. By way of example only, an exemplary preferred material is $MSi_w$, where "w" is from 1 to 3.0 and "M" is at least one of Ta, Hf, Mo, and W. In one preferred embodiment, conductive layer 18 is preferably void of detectable nitrogen to preclude risk of forming an insulative silicon nitride. An exemplary preferred thickness range for electrically conductive layer 18 is from 5 Angstroms to 500 Angstroms, with from 5 Angstroms to 50 Angstroms being more preferred, and a 50 Angstroms $MSi_2$ layer (i.e., even more specifically $TaSi_2$) being a specific preferred example. Such might be deposited by any suitable method, including by way of example only sputtering, chemical vapor deposition and atomic layer deposition. If chemical vapor depositing or atomic layer depositing, exemplary precursors/gasses include $SiH_4$ and $TaCl_4$.

Figure 4:
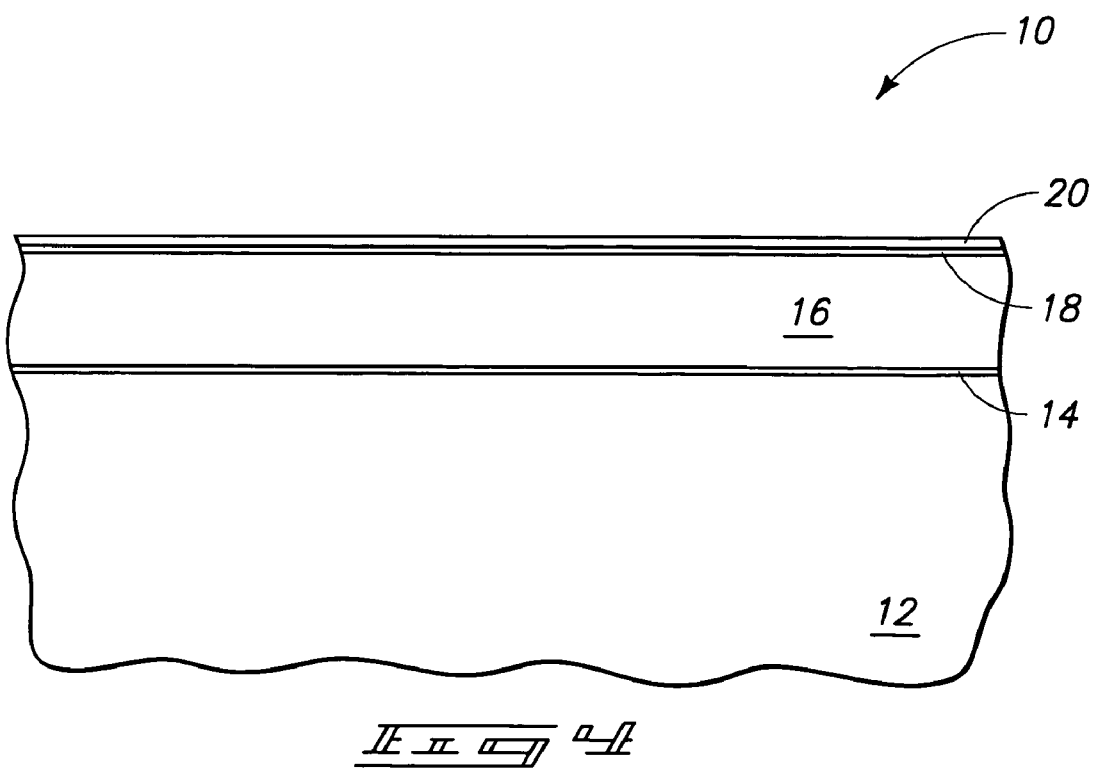
FIG. 4 is a view of the FIG. 3 wafer fragment at a point of processing subsequent to that depicted by FIG. 3.

Referring to FIG. 4, an $MSi_xN_y$-comprising layer 20 has been formed over, and preferably on as shown, electrically conductive layer 18, and where "x" is from 0 (zero) to 3.0, "y" is from 0.5 to 10, and "M" is at least one of Ta, Hf, Mo, and W. Preferably, "x" is greater than zero, and even more preferably "x" is at least 1. An exemplary preferred thickness range for $MSi_xN_y$-comprising layer 20 is from 10 Angstroms to 500 Angstroms, with from 10 Angstroms to 50 Angstroms being more preferred. A specific example is a 40 Angstroms thick $MSi_xN_y$-comprising layer where "x" equals 2 and "y" equals 5. $MSi_xN_y$-comprising layer might be deposited by any existing or yet-to-be developed method, for example including by sputtering, by chemical vapor deposition and by atomic layer deposition. A preferred exemplary sputtering technique comprises a gas sputtered against a target comprising $MSi_w$, with nitrogen being provided at least in part from gaseous $N_2$ and/or $NH_3$. For example in one specific preferred embodiment, an inert gas and $N_2$ are injected (together or separately) into a sputtering chamber in which the substrate is received at a ratio of inert gas to $N_2$ of about 3:1 by volume.

Figure 5:
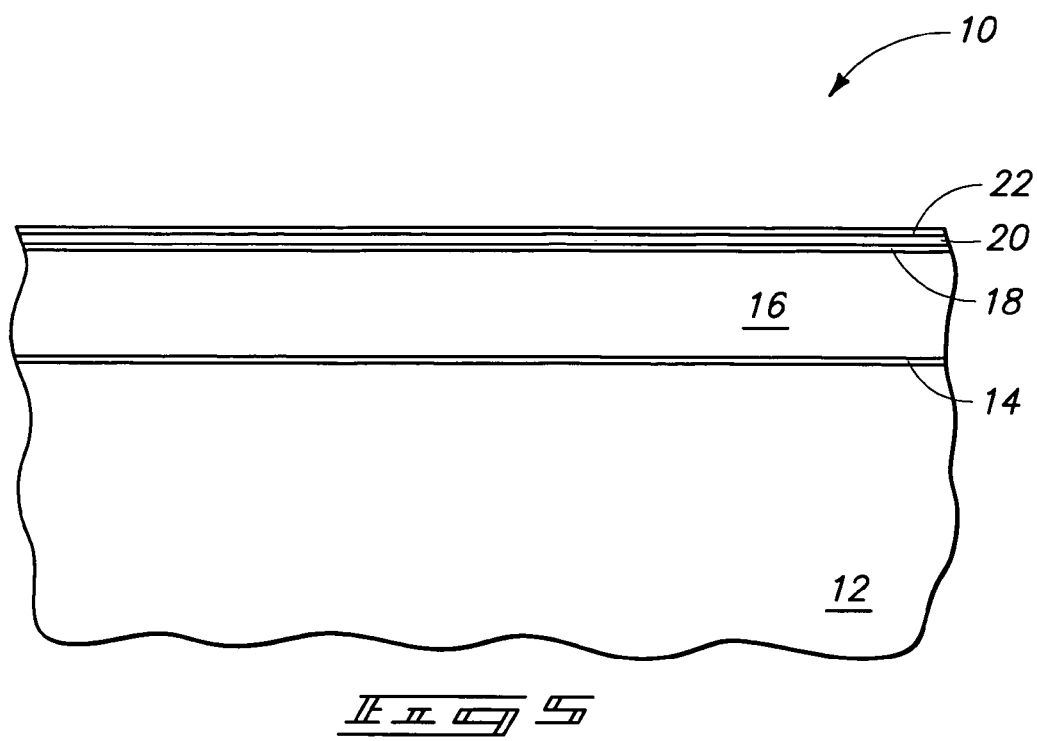
FIG. 5 is a view of the FIG. 4 wafer fragment at a point of processing subsequent to that depicted by FIG. 4.

Referring to FIG. 5, an $MSi_z$-comprising layer 22 is formed over, and preferably on as shown, $MSi_xN_y$-comprising layer 20, and where "z" is from 1 to 3.0 and "M" is at least one of Ta, Hf, Mo, and W. $MSi_z$-comprising layer 22 and electrically conductive layer 18 might be of the same composition (meaning of the same components and in their respective quantities), or of different compositions (meaning of one or both of different components or quantities of the same components). An exemplary preferred thickness range for $MSi_z$-comprising layer 22 is from 5 Angstroms to 500 Angstroms, more preferably from 5 Angstroms to 50 Angstroms, with a 60 Angstroms thick $MSi_2$ layer being a specific preferred example.

Figure 6:
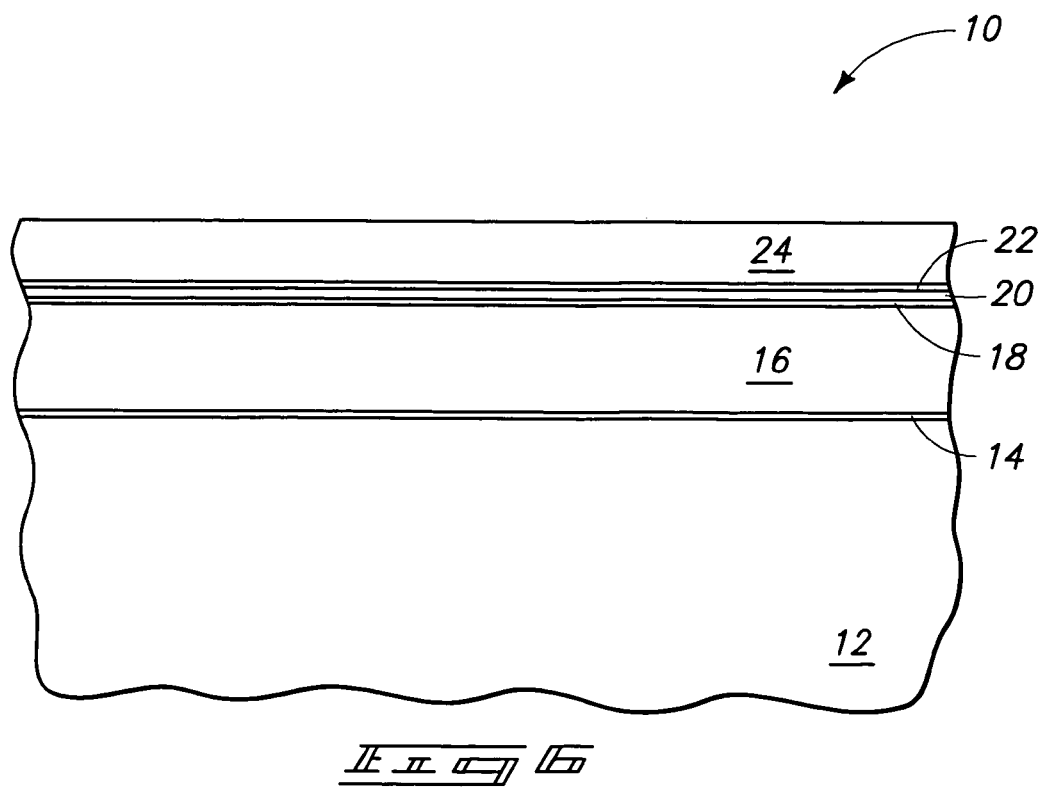
FIG. 6 is a view of the FIG. 5 wafer fragment at a point of processing subsequent to that depicted by FIG. 5.

Referring to FIG. 6, a $TiSi_a$-comprising layer 24 has been formed over, and preferably on as shown, $MSi_z$-comprising layer 22, where "a" is from 1 to 3.0. An exemplary preferred thickness range is from 100 Angstroms to 5,000 Angstroms, with a 400 Angstroms thick layer of $TiSi_2$ being a specific preferred example. In specific preferred examples, electrically conductive layer 18, $MSi_xN_y$-comprising layer 20, and MSi$_z$-comprising layer 22 have a combined thickness which is less than that of TiSi$_a$-comprising layer 24, and in certain preferred embodiments less than that of silicon-comprising layer 16.

Figure 7:
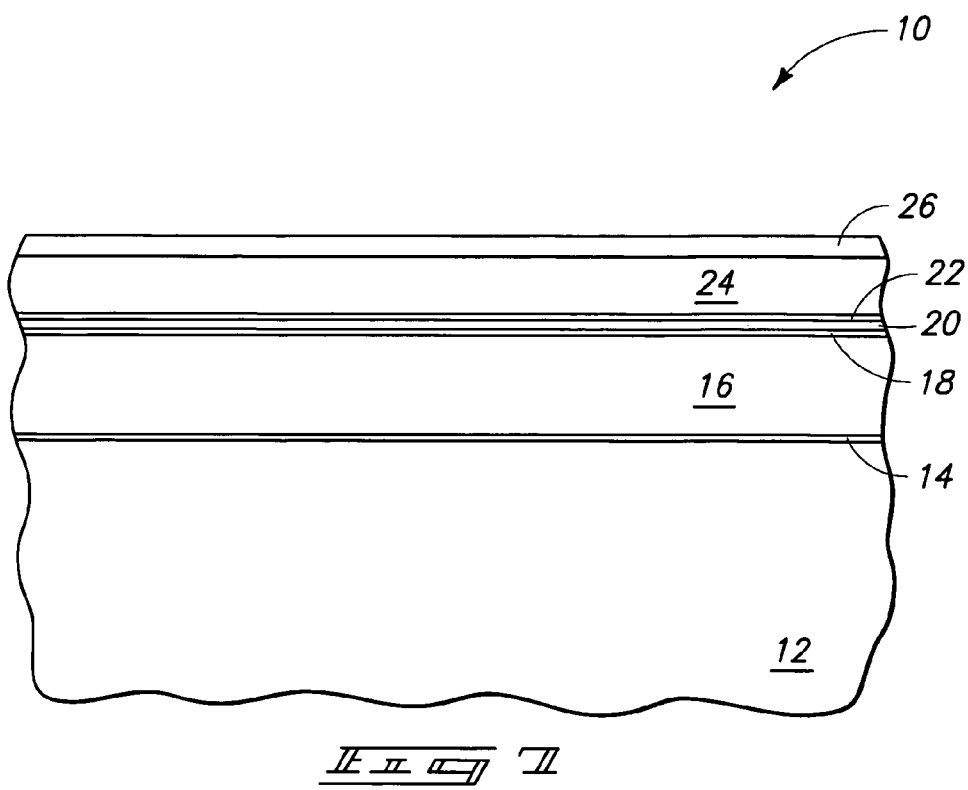
FIG. 7 is a view of the FIG. 6 wafer fragment at a point of processing subsequent to that depicted by FIG. 6.

Referring to FIG. 7, an electrically insulative layer 26 has been formed over, and preferably on as shown, TiSi$_a$-comprising layer 24. Exemplary preferred materials include one or both of silicon dioxide and silicon nitride. Not being electrically conductive, layer 26 will not constitute a conductive portion of the line being formed, and is of course optional.

Figure 8:
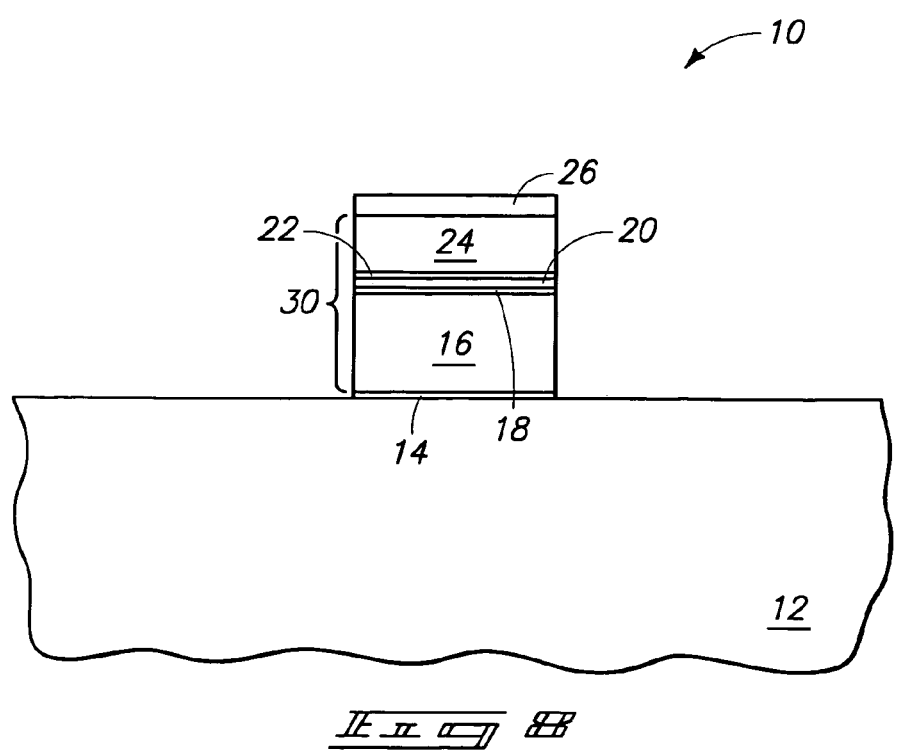
FIG. 8 is a view of the FIG. 7 wafer fragment at a point of processing subsequent to that depicted by FIG. 7.

Referring to FIG. 8, silicon-comprising layer 16, electrically conductive layer 18, MSi$_x$N$_y$-comprising layer 20, MSi$_z$-comprising layer 22 and TiSi$_a$-comprising layer 24 have been patterned into a stack comprising an electrically conductive line 30. In the depicted exemplary preferred FIG. 8 embodiment, gate dielectric layer 14 and insulative layer 26 have also been patterned commensurate with the patterning of electrically conductive layers 16, 18, 20, 22 and 24. Any patterning technique is contemplated, and whether existing or yet-to-be developed. By way of example only, exemplary techniques include photolithographic patterning and etch, and laser patterning. An exemplary dry anisotropic etching chemistry for etching TiSi$_a$ includes CF$_4$ and Cl$_2$. An exemplary dry anisotropic etching chemistry for etching MSi$_w$, MSi$_x$N$_y$ and MSi$_x$ collectively also includes CF$_4$ and Cl$_2$. An exemplary dry anisotropic etching chemistry for etching a polysilicon-comprising layer includes HBr, He and O$_2$.

MSi$_x$ has been previously promoted for use as a titanium silicide agglomeration-barrier and as a C54 phase titanium silicide promoter, for example as disclosed in our U.S. patent application Ser. No. 10/609,282, filed on Jun. 26, 2003, entitled "Methods of Forming Metal Silicide, and Semiconductor Constructions Comprising Metal Silicide", and naming Yongjun Jeff Hu as an inventor, now U.S. Pat. No. 7,282,443, the disclosure of which is hereby fully incorporated by reference as if included in its entirety herein. Without being limited by any theory or effect unless literally appearing in a claim in this application, the provision of an additional MSi$_x$N$_y$-comprising layer can further reduce titanium silicide agglomeration relative to underlying silicon-comprising layers in the fabrication of electrically conductive lines, and regardless of amorphous or crystalline phases. An electrically conductive layer is ideally interposed between the silicon-comprising layer and the MSi$_x$N$_y$-comprising layer towards precluding nitrogen of the MSi$_x$N$_y$-comprising layer from coming into contact with the silicon which might undesirably form an insulative silicon nitride. Further using the above described etching chemistries, it was found that a conductive line stack in accordance with an aspect of the invention having MSi$_2$ over MSi$_2$N$_y$ over MSi$_2$ exhibited less undercut than a line stack having MSi$_2$ which was void of MSi$_2$N$_y$.

In one aspect, the invention also contemplates a method of reducing titanium silicide agglomeration in the fabrication of titanium silicide over polysilicon transistor gate lines, which comprises interposing a composite of an MSi$_z$-comprising layer over an MSi$_x$N$_y$-comprising layer over an MSi$_w$-comprising layer intermediate the titanium silicide and polysilicon, where "w" and "z", respectively, are from 1 to 3.0, where "x" is from zero to 3.0, where "y" is from 0.5 to 10, and "M" is at least one of Ta, Hf, Mo, and W.

The invention also contemplates electrically conductive lines, for example as described above, independent of the method of fabrication, and of course independent of the preferred effects described above.

Figure 9:
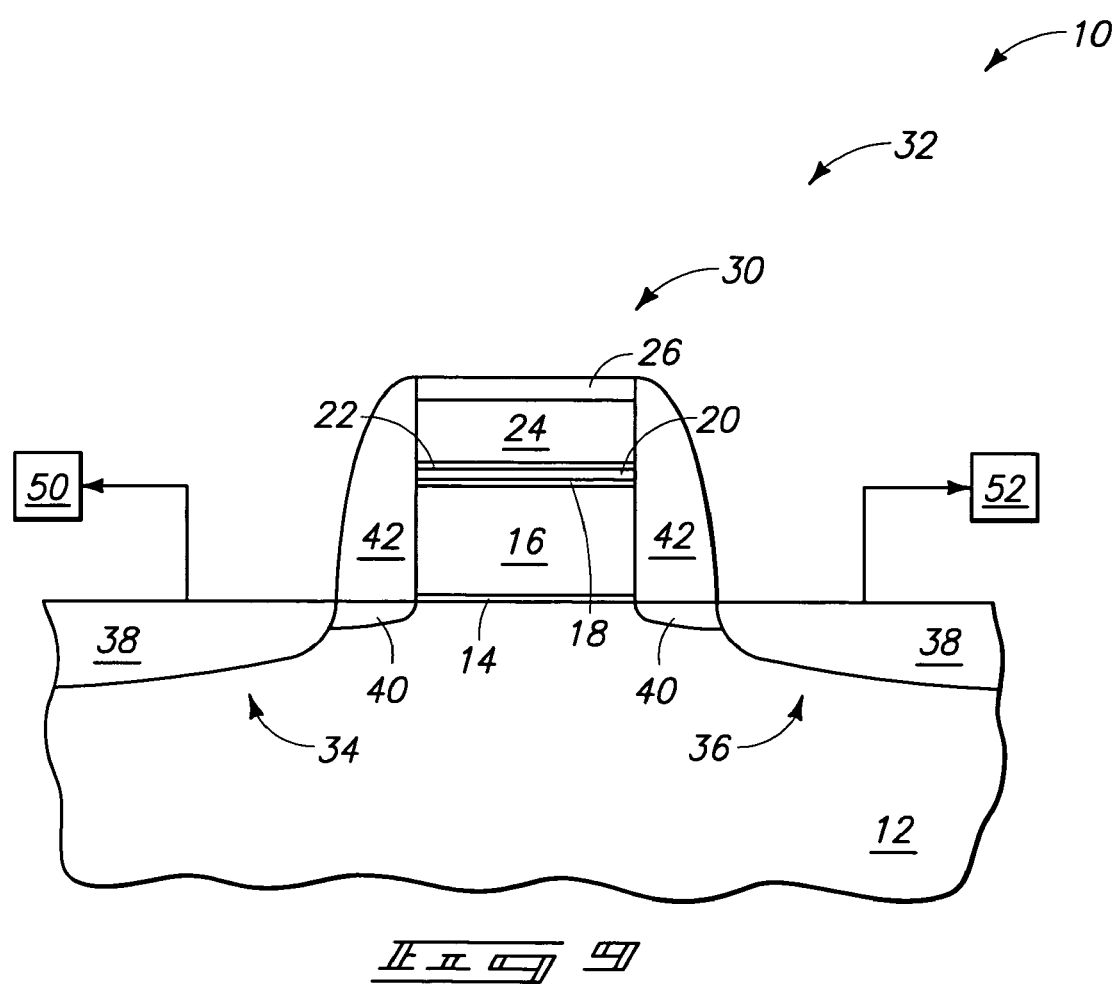
FIG. 9 is a view of the FIG. 8 wafer fragment at a point of processing subsequent to that depicted by FIG. 8.

Referring to FIG. 9, electrically conductive line 30 can be utilized as a wordline or other field effect transistor gate line, and can be fabricated into transistor gate structures at appropriate locations. Specifically and by way of example only, FIG. 9 shows a location where line 30 has been incorporated into a transistor structure 32. Source/drain regions 34 and 36 have been formed within substrate 12. Such exemplary source/drain regions are depicted as comprising a deep, heavily-doped portion, 38 and a shallow, lightly-doped, portion 40. Source/drain regions 34 and 36 can be formed utilizing conventional methods or yet-to-be developed methods, and the conductivity-enhancing dopant within regions 38 and 40 can comprise either p-type dopant or n-type dopant, by way of example. Electrically insulative sidewall spacers 42 have been formed along the sidewalls of electrically conductive line 30. Exemplary preferred materials include one or both of silicon nitride and silicon dioxide.

Transistor device 32 can be incorporated into a memory cell. In the depicted exemplary construction, device 32 is incorporated into a DRAM cell. Specifically, source/drain region 34 is electrically connected to a storage device 50, and the other source/drain region 36 is electrically connected to a bitline 52. Storage device 50 can comprise any suitable device, including a capacitor, for example. Bitline 52 can comprise any suitable construction. Electrically conductive line 30 can be considered to be part of an integrated circuit, for example the DRAM integrated circuitry just described.

Figure 10:
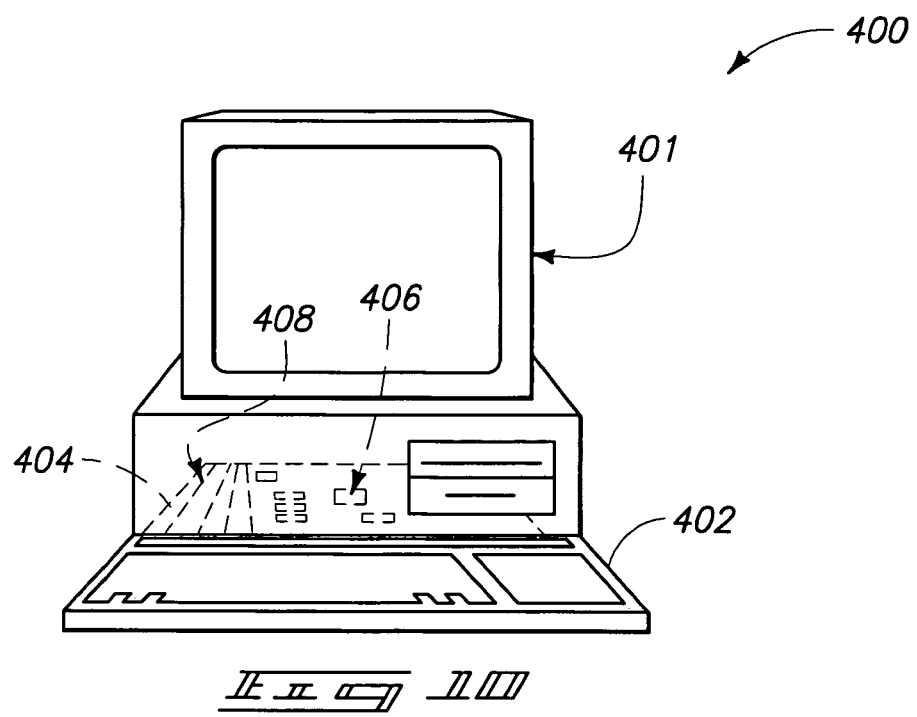
FIG. 10 is a diagrammatic view of a computer illustrating an exemplary application of the present invention.
Figure 11:
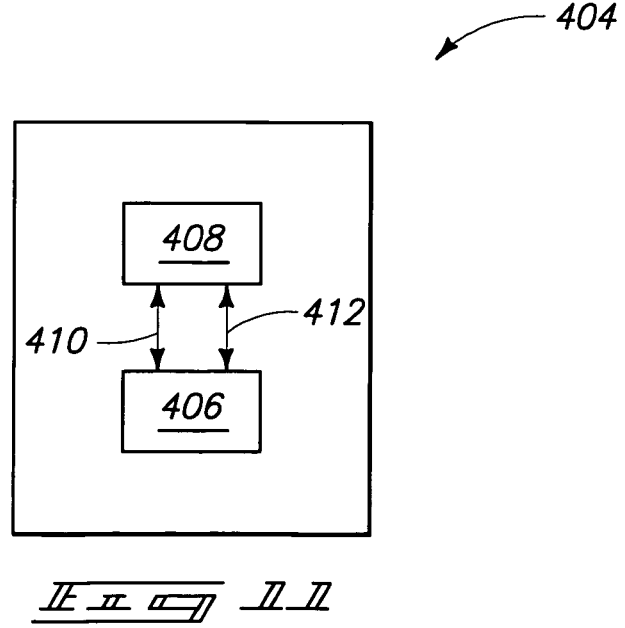
FIG. 11 is a block diagram showing particular features of the motherboard of the FIG. 10 computer.

FIG. 10 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices, by way of example only, include SDRAM, DDR SDRAM, SLDRAM, VRAM and Direct RDRAM, as well as others such as SRAM or Flash memories.

Figure 12:
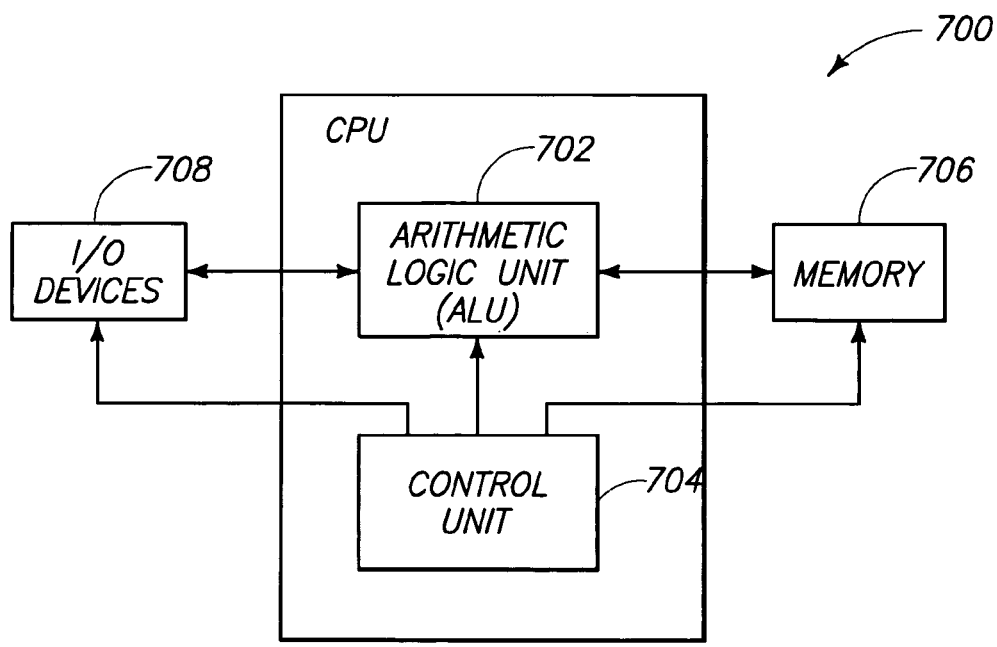
FIG. 12 is a high-level block diagram of an electronic system according to an exemplary aspect of the present invention.

FIG. 12 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by processor 702 and other interactions between processor 702, memory device unit 706 and I/O devices 708. Control unit 704 coordinates all operations of processor 702, memory device 706 and I/O devices 708 by continuously cycling through a set of operations that cause instructions to be fetched from memory device 706 and executed. In various embodiments, memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

Figure 13:
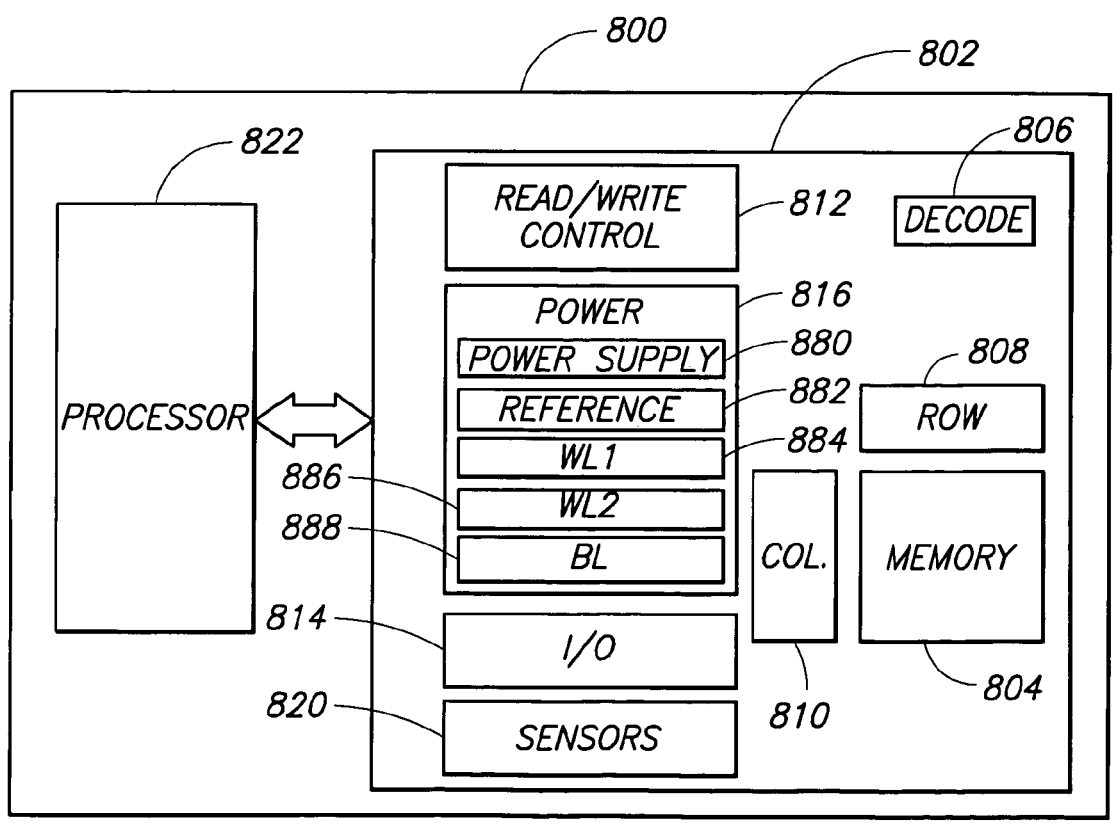
FIG. 13 is a simplified block diagram of an exemplary electronic system according to an aspect of the present invention.

FIG. 13 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. Memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. System 800 also includes a processor 822, or memory controller for memory accessing.

Memory device 802 receives control signals 824 from processor 822 over wiring or metallization lines. Memory device 802 is used to store data which is accessed via I/O lines. It will be appreciated by those skilled in the art that additional circuitry and control signals can be provided, and that memory device 802 has been simplified to help focus on the invention. At least one of processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an electrically conductive line, comprising:
   providing a silicon-comprising layer over a substrate;
   forming an electrically conductive layer over the silicon-comprising layer;
   forming an $MSi_xN_y$-comprising layer over the electrically conductive layer, where "x" is greater than zero and less than or equal to 3.0, "y" is from 0.5 to 10, and "M" is at least one of Ta, Hf, Mo, and W;
   forming an $MSi_z$-comprising layer over the $MSi_xN_y$-comprising layer, where "z" is from 1 to 3.0;
   forming a $TiSi_a$-comprising layer over the $MSi_z$-comprising layer, where "a" is from 1 to 3.0; and
   patterning the silicon-comprising layer, the electrically conductive layer, the $MSi_xN_y$-comprising layer, the $MSi_z$-comprising layer, and the $TiSi_a$-comprising layer into a stack comprising an electrically conductive line.

2. The method of claim 1 wherein "x" is at least 1.

3. The method of claim 1 comprising forming the $MSi_xN_y$-comprising layer by sputtering.

4. The method of claim 3 wherein the sputtering comprises a gas sputtered against a target comprising $MSi_w$, where "w" is from 1 to 3.0, nitrogen being provided in the $MSi_xN_y$-comprising layer at least in part from at least one of gaseous $NH_3$ and gaseous $N_2$.

5. The method of claim 4 wherein the sputtering occurs within a chamber, the sputtering comprising injecting an inert gas and $N_2$ into the chamber during the sputtering at a ratio of inert gas to $N_2$ of about 3:1 by volume.

6. The method of claim 4 wherein "w" is greater than zero and "x" is greater than zero.

7. The method of claim 1 comprising forming the $MSi_xN_y$-comprising layer by chemical vapor deposition.

8. The method of claim 1 comprising forming the $MSi_xN_y$-comprising layer by atomic layer deposition.

9. The method of claim 1 comprising forming the $MSi_z$-comprising layer on the $MSi_xN_y$-comprising layer.

10. The method of claim 9 comprising forming the $TiSi_a$-comprising layer on the $MSi_z$-comprising layer.

11. The method of claim 1 wherein the electrically conductive layer is void of detectable nitrogen.

12. The method of claim 1 wherein the electrically conductive layer and the $MSi_z$-comprising layer have respective thicknesses from 5 Angstroms to 500 Angstroms.

13. The method of claim 1 wherein the $MSi_xN_y$-comprising layer has a thickness from 10 Angstroms to 500 Angstroms.

14. The method of claim 13 wherein the $Msi_xN_y$-comprising layer has a thickness from 10 Angstroms to 50 Angstroms.

15. The method of claim 1 comprising forming the conductive line into a transistor gate line received over a gate dielectric.

16. The method of claim 1 comprising fabricating the electrically conductive line into memory integrated circuitry.

17. The method of claim 1 comprising fabricating the electrically conductive line into memory integrated circuitry comprising DRAM.

18. The method of claim 1 wherein M comprises Ta.

19. The method of claim 1 wherein M comprises Hf.

20. The method of claim 1 wherein M comprises Mo.

21. A method of forming an electrically conductive line, comprising:
   providing a silicon-comprising layer over a substrate;
   forming an electrically conductive layer over the silicon-comprising layer, the electrically conductive layer comprising $MSi_w$, where "w" is from 1 to 3.0;
   forming an $MSi_xN_y$-comprising layer over the electrically conductive layer, where "x" is from 0 to 3.0, "y" is from 0.5 to 10, and "M" is at least one of Ta, Hf, Mo, and W;
   forming an $MSi_z$-comprising layer over the $MSi_xN_y$-comprising layer, where "z" is from 1 to 3.0;
   forming a $TiSi_a$-comprising layer over the $MSi_z$-comprising layer, where "a" is from 1 to 3.0; and
   patterning the silicon-comprising layer, the electrically conductive layer, the $MSi_xN_y$-comprising layer, the $MSi_z$-comprising layer, and the $TiSi_a$-comprising layer into a stack comprising an electrically conductive line.

22. The method of claim 21 wherein the electrically conductive layer and the $MSi_z$-comprising layer are of the same composition.

23. The method of claim 21 wherein the electrically conductive layer and the $MSi_z$-comprising layer are of different compositions.

24. The method of claim 21 wherein the $MSi_xN_y$-comprising layer is formed on the $MSi_w$.

25. The method of claim 21 wherein the $MSi_z$-comprising layer is formed on the $MSi_xN_y$-comprising layer.

26. The method of claim 21 wherein the $MSi_xN_y$-comprising layer is formed on the $MSi_w$ and the $MSi_z$-comprising layer is formed on the $MSi_xN_y$-comprising layer.

27. The method of claim 21 wherein the $MSi_xN_y$-comprising layer is formed on the $MSi_w$, the $MSi_z$-comprising layer is formed on the $MSi_xN_y$-comprising layer, and the $TiSi_a$-comprising layer is formed on the $MSi_z$-comprising layer.

28. The method of claim 27 wherein the $MSi_w$ is formed on the silicon-comprising layer.

29. A method of forming an electrically conductive line, comprising:
   providing a silicon-comprising layer over a substrate;
   forming an electrically conductive layer over the silicon-comprising layer;
   forming an $MSi_xN_y$-comprising layer over the electrically conductive layer, where "x" is from 0 to 3.0, "y" is from 0.5 to 10, and "M" is at least one of Ta, Hf, Mo, and W;
   forming an $MSi_z$-comprising layer over the $MSi_xN_y$-comprising layer, where "z" is from 1 to 3.0;
   forming a $TiSi_a$-comprising layer over the $MSi_z$-comprising layer, where "a" is from 1 to 3.0;
   the electrically conductive layer, the $MSi_xN_y$-comprising layer, and the $MSi_z$-comprising layer being formed to have a combined thickness which is less than that of the $TiSi_a$-comprising layer; and
   patterning the silicon-comprising layer, the electrically conductive layer, the $MSi_xN_y$-comprising layer, the $MSi_z$-comprising layer, and the $TiSi_a$-comprising layer into a stack comprising an electrically conductive line.

30. A method of forming an electrically conductive line, comprising:
   providing a silicon-comprising layer over a substrate;
   forming an electrically conductive layer over the silicon-comprising layer;
   forming an $MSi_xN_y$-comprising layer over the electrically conductive layer, where "x" is from 0 to 3.0, "y" is from 0.5 to 10, and "M" is at least one of Ta, Hf, Mo, and W;
   forming an $MSi_z$-comprising layer over the $MSi_xN_y$-comprising layer, where "z" is from 1 to 3.0;
   forming a $TiSi_a$-comprising layer over the $MSi_z$-comprising layer, where "a" is from 1 to 3.0;
   the electrically conductive layer, the $MSi_xN_y$-comprising layer, and the $MSi_z$-comprising layer being formed to have a combined thickness which is less than that of the silicon-comprising layer; and
   patterning the silicon-comprising layer, the electrically conductive layer, the $MSi_xN_y$-comprising layer, the $MSi_z$-comprising layer, and the $TiSi_a$comprising layer into a stack comprising an electrically conductive line.

31. A method of forming an electrically conductive line, comprising:
   providing a silicon-comprising layer over a substrate;
   forming an electrically conductive layer over the silicon-comprising layer;
   forming an $MSi_xN_y$-comprising layer over the electrically conductive layer, where "x" is from 0 to 3.0, "y" is from 0.5 to 10, and "M" is at least one of Ta, Hf, Mo, and W;
   forming an $MSi_z$-comprising layer over the $MSi_xN_y$-comprising layer, where "z" is from 1 to 3.0;
   forming a $TiSi_a$-comprising layer over the $MSi_z$-comprising layer, where "a" is from 1 to 3.0;
   the electrically conductive layer, the $MSi_xN_y$-comprising layer, and the $MSi_z$-comprising layer being formed to have a combined thickness which is less than that of each of the $TiSi_a$-comprising layer and the silicon-comprising layer; and
   patterning the silicon-comprising layer, the electrically conductive layer, the $MSi_xN_y$-comprising layer, the $MSi_z$-comprising layer, and the $TiSi_a$-comprising layer into a stack comprising an electrically conductive line.

32. A method of forming an electrically conductive line, comprising:
   providing a silicon-comprising layer over a substrate;
   forming an electrically conductive layer over the silicon-comprising layer;
   forming an $MSi_xN_y$-comprising layer over the electrically conductive layer, where "x" is from 0 to 3.0, "y" is from 0.5 to 10, and "M" comprises at least one of Hf and Mo;
   forming an $MSi_z$-comprising layer over the $MSi_xN_y$-comprising layer, where "z" is from 1 to 3.0;
   forming a $TiSi_a$-comprising layer over the $MSi_z$-comprising layer, where "a" is from 1 to 3.0; and
   patterning the silicon-comprising layer, the electrically conductive layer, the $MSi_xN_y$-comprising layer, the $MSi_z$-comprising layer, and the $TiSi_a$-comprising layer into a stack comprising an electrically conductive line.

33. The method of claim 32 wherein M comprises Hf.

34. The method of claim 32 wherein M comprises Mo.

35. A method of reducing titanium silicide agglomeration in fabrication of titanium silicide over polysilicon transistor gate lines comprising interposing a composite of an $MSi_z$-comprising layer over an $MSi_xN_y$-comprising layer over an $MSi_w$-comprising layer intermediate the titanium silicide and polysilicon, where "w" and "z" respectively are from 1 to 3.0, where "x" is greater than zero and less than or equal to 3.0, "y" is from 0.5 to 10, and "M" is at least one of Ta, Hf, Mo, and W.

36. The method of claim 32 wherein "x" is at least 1.

* * * * *

UNITED STATES PATENT AND TRADEMARK OFFICE
CERTIFICATE OF CORRECTION

PATENT NO. : 7,510,966 B2 Page 1 of 1
APPLICATION NO. : 11/074106
DATED : March 31, 2009
INVENTOR(S) : Qi Pan et al.

It is certified that error appears in the above-identified patent and that said Letters Patent is hereby corrected as shown below:

In column 8, line 31, in Claim 1, delete "a"is" and insert -- "a" is --, therefor.

In column 8, line 66, in Claim 14, delete "$Msi_xN_y$" and insert -- $MSi_xN_y$ --, therefor.

In column 10, line 19, in Claim 30, delete "$TiSi_a$comprising" and insert -- $TiSi_a$ -comprising --, therefor.

In column 11, line 1, in Claim 36, delete "claim 32" and insert -- claim 35 --, therefor.

Signed and Sealed this

Seventh Day of July, 2009

JOHN DOLL
*Acting Director of the United States Patent and Trademark Office*